(12) United States Patent
Nakajima

(10) Patent No.: US 7,404,158 B2
(45) Date of Patent: Jul. 22, 2008

(54) INSPECTION METHOD AND INSPECTION APPARATUS FOR SEMICONDUCTOR INTEGRATED CIRCUIT

(75) Inventor: Yukinori Nakajima, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 4 days.

(21) Appl. No.: 11/250,377

(22) Filed: Oct. 17, 2005

(65) Prior Publication Data

US 2006/0090147 A1    Apr. 27, 2006

(30) Foreign Application Priority Data

Oct. 19, 2004   (JP)   ............................. 2004-304494

(51) Int. Cl.
*G06F 17/50* (2006.01)
(52) U.S. Cl. .............................................. 716/4; 716/1
(58) Field of Classification Search ................... 716/1, 716/4, 5, 6; 702/117; 714/724, 725; 324/765, 324/766, 158.1
See application file for complete search history.

(56) References Cited

U.S. PATENT DOCUMENTS

| 3,423,677 | A | * | 1/1969 | Hamilton et al. ............ 324/73.1 |
| 3,889,188 | A | * | 6/1975 | Trindade .................... 324/769 |
| 5,321,354 | A | * | 6/1994 | Ooshima et al. ............. 324/765 |
| 5,345,401 | A | * | 9/1994 | Tani ............................. 703/16 |
| 5,497,381 | A | * | 3/1996 | O'Donoghue et al. ........ 714/745 |
| 5,610,925 | A | * | 3/1997 | Takahashi ................... 714/724 |
| 5,625,288 | A | * | 4/1997 | Snyder et al. ............ 324/158.1 |
| 5,655,109 | A | * | 8/1997 | Hamid ......................... 716/18 |
| 5,668,745 | A | * | 9/1997 | Day ............................ 702/121 |
| 5,854,796 | A | * | 12/1998 | Sato ............................ 714/718 |
| 5,880,967 | A | * | 3/1999 | Jyu et al. ........................ 716/6 |
| 5,886,363 | A | * | 3/1999 | Hamada et al. ............... 257/48 |
| 5,933,356 | A | * | 8/1999 | Rostoker et al. .............. 703/15 |
| 6,184,048 | B1 | * | 2/2001 | Ramon ......................... 438/14 |
| 6,209,122 | B1 | * | 3/2001 | Jyu et al. ........................ 716/6 |
| 6,249,139 | B1 | * | 6/2001 | Fu et al. ...................... 324/766 |
| 6,326,792 | B1 | * | 12/2001 | Okada ........................ 324/456 |
| 6,327,686 | B1 | * | 12/2001 | Grundmann et al. ......... 714/738 |
| 6,334,100 | B1 | * | 12/2001 | Ahrikencheikh et al. ...... 703/14 |
| 6,378,109 | B1 | * | 4/2002 | Young et al. ................... 716/4 |
| 6,404,219 | B1 | * | 6/2002 | Yamamoto ................... 324/765 |
| 6,405,148 | B1 | * | 6/2002 | Hayashi et al. .............. 702/117 |

(Continued)

FOREIGN PATENT DOCUMENTS

JP          2000-98002          4/2000

*Primary Examiner*—Vuthe Siek
*Assistant Examiner*—Patrick Sandoval
(74) *Attorney, Agent, or Firm*—Nixon & Vanderhye P.C.

(57) ABSTRACT

In a semiconductor integrated circuit inspection method of inspecting a semiconductor integrated circuit including plural transistors according to which a test pattern generated for the semiconductor integrated circuit is input to an input terminal of the semiconductor integrated circuit, the time during which a voltage applied upon each of the transistors remains equal to or higher than a predetermined voltage is measured in response to inputting of the test pattern at the input terminal, and the ratio of thus measured time to the inspection time for the semiconductor integrated circuit is calculated. In certain example embodiments of this invention, this is advantageous in that it may be possible to verify whether a generated test pattern is preferable by grasping a state of voltage applied upon each transistor during a reliability test, so as to help maintain accuracy of reliability testing.

9 Claims, 7 Drawing Sheets

U.S. PATENT DOCUMENTS

| | | | |
|---|---|---|---|
| 6,405,348 B1* | 6/2002 | Fallah-Tehrani et al. | 716/4 |
| 6,434,704 B1* | 8/2002 | Dean et al. | 713/320 |
| 6,536,024 B1* | 3/2003 | Hathaway | 716/6 |
| 6,574,760 B1* | 6/2003 | Mydill | 714/724 |
| 6,578,169 B1* | 6/2003 | Le et al. | 714/736 |
| 6,631,502 B2* | 10/2003 | Buffet et al. | 716/4 |
| 6,714,032 B1* | 3/2004 | Reynick | 324/765 |
| 6,725,434 B2* | 4/2004 | Murayama | 716/5 |
| 6,799,307 B1* | 9/2004 | Lipton et al. | 716/5 |
| 6,808,945 B1* | 10/2004 | Wang et al. | 438/14 |
| 6,834,380 B2* | 12/2004 | Khazei | 716/10 |
| 6,873,171 B2* | 3/2005 | Reynick | 324/765 |
| 6,944,331 B2* | 9/2005 | Schmidt et al. | 382/165 |
| 6,961,674 B2* | 11/2005 | Gedamu et al. | 702/183 |
| 7,089,512 B2* | 8/2006 | Iadanza et al. | 716/4 |
| 7,151,367 B2* | 12/2006 | Belleau | 324/158.1 |
| 7,225,378 B2* | 5/2007 | Ishida et al. | 714/741 |
| 2002/0040466 A1* | 4/2002 | Khazei | 716/9 |
| 2004/0025123 A1* | 2/2004 | Angilivelil | 716/4 |
| 2004/0160239 A1* | 8/2004 | Reynick | 324/765 |
| 2006/0010410 A1* | 1/2006 | Curtin et al. | 716/6 |
| 2006/0208754 A1* | 9/2006 | Takeuchi et al. | 324/765 |

* cited by examiner

SCHEMATIC CIRCUIT DIAGRAM

SPICE NET LIST

```
MP0  OUT  A  VDD  VDD  TP
MP1  OUT  B  VDD  VDD  TP
MN0  OUT  A  Y    GND  TN
MN1  Y    B  GND  GND  TN
```

F I G. 4

| TRANSISTOR NAME | DRAIN NODE | GATE NODE | SOURCE NODE | BULK NODE |
|---|---|---|---|---|
| MP0 | OUT | A | VDD | VDD |
| MP1 | OUT | B | VDD | VDD |
| MN0 | OUT | A | Y | GND |
| MN1 | Y | B | GND | GND |

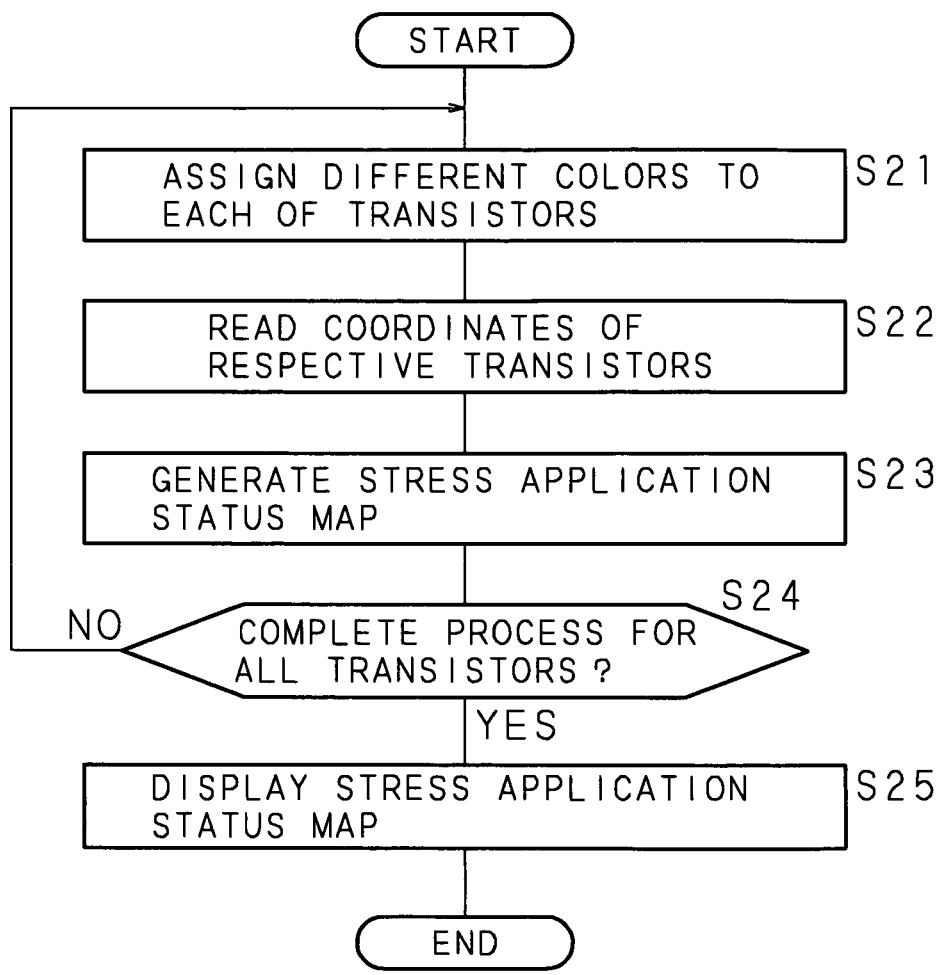

INSPECTION METHOD AND INSPECTION APPARATUS FOR SEMICONDUCTOR INTEGRATED CIRCUIT

CROSS-REFERENCE TO RELATED APPLICATIONS

This Nonprovisional application claims priority under 35 U.S.C. § 119(a) on Patent Application No.2004-304494 filed in Japan on Oct. 19, 2004, the entire contents of which are hereby incorporated by reference.

BACKGROUND OF THE INVENTION

1. Field of the Invention

The present invention relates to a semiconductor integrated circuit inspection method and a semiconductor integrated circuit inspection apparatus in which a test pattern generated for a semiconductor integrated circuit comprising plural transistors is input at an input terminal of the semiconductor integrated circuit and the semiconductor integrated circuit is inspected.

2. Description of Related Art

For shipment of reliable and high-quality products after pre-shipment defectives detection, semiconductor integrated circuits are tested through various types of tests (See Japanese Patent Application Laid Open No. 2000-98002 for instance.) A reliability test on a semiconductor integrated circuit includes inspection which aims at confirming the reliability of a gate oxide film of each transistor which forms the semiconductor integrated circuit. To be more specific, a test pattern for inspection of gate oxide films is generated for a semiconductor integrated circuit which needs be inspected, and with a higher voltage than a rated voltage applied upon a power source terminal of the semiconductor integrated circuit in a high-temperature environment, the generated test pattern is input at an input terminal of the semiconductor integrated circuit. The specified voltage is thus applied for a necessary amount of time upon the gate oxide film of each transistor which forms the semiconductor integrated circuit, thereby inspecting the durability of the gate oxide film of each transistor.

During the inspection, it is necessary to apply a proper voltage upon all transistors which form the semiconductor integrated circuit for a proper amount of time, and therefore, highly accurate inspection is impossible if the voltages applied upon the transistors are different or the application time varies. It is desired to generate a test pattern with which it is possible to apply an appropriate voltage upon all transistors which form the semiconductor integrated circuit for an appropriate amount of time.

However, it is difficult to grasp whether a proper voltage is applied upon each transistor which forms the semiconductor integrated circuit for a proper amount of time during the inspection above: It is difficult to grasp which level of voltage is applied upon which transistor for how long during the inspection. The difficulty of verifying whether a generated test pattern is proper or not leads to a problem that it is extremely difficult to generate a test pattern which realizes application of an appropriate voltage upon all transistors. In addition, as the circuit size of a semiconductor integrated circuit has grown, a burden of test pattern generation has increased.

BRIEF SUMMARY OF THE INVENTION

The present invention has been made in light of the circumstance above, and accordingly aims at providing a semiconductor integrated circuit inspection method and a semiconductor integrated circuit inspection apparatus with which it is possible to verify whether a generated test pattern is preferable or not by grasping the state of a voltage applied upon each transistor during a reliability test and it is possible, using a favorable test pattern, to maintain the accuracy of the reliability test.

Other object of the present invention is to provide a semiconductor integrated circuit inspection method with which it is possible to verify whether a test pattern is preferable or not based on the ratio of the transistors upon which an appropriate voltage is applied for an appropriate amount of time during a reliability test.

Another object of the present invention is to provide a semiconductor integrated circuit inspection method with which it is possible to grasp the state of a voltage applied upon each transistor during a reliability test while referring to the location of each transistor and it is possible to verify whether a test pattern is preferable or not based on variations between voltages applied upon the respective transistors.

The semiconductor integrated circuit inspection method according to the present invention is characterized in comprising the steps of inputting a test pattern, which is generated for a semiconductor integrated circuit comprising plural transistors, to the semiconductor integrated circuit; measuring the time during which a voltage applied upon each one of the transistors remains equal to or higher than a predetermined voltage, in response to inputting of the test pattern; and calculating the ratio of the measured time to the inspection time for the semiconductor integrated circuit.

According to the present invention, in response to inputting of the test pattern generated for the semiconductor integrated circuit comprising the plural transistors to the semiconductor integrated circuit, the time during which the voltage applied upon each one of the transistors remains equal to or higher than the predetermined voltage is measured and the ratio of thus measured time to the inspection time for the semiconductor integrated circuit is calculated. Hence, it is possible to grasp, as for each transistor, the ratio of the application time of the voltage which is equal to or higher than the predetermined voltage to the inspection time, in response to inputting of the test pattern generated for inspection of the semiconductor integrated circuit.

The semiconductor integrated circuit inspection method according to the present invention is characterized in that the time during which the voltage applied upon the gate of each of the transistors remains equal to or higher than the predetermined voltage is measured, in response to inputting of the test pattern.

According to the present invention, as the test pattern is input to the semiconductor integrated circuit comprising the plural transistors, the time during which the voltage applied upon the gate of each transistor remains equal to or higher than the predetermined voltage is measured. Hence, it is possible to grasp the state of the voltage applied upon each transistor in response to inputting of the test pattern generated for inspection of the semiconductor integrated circuit to an input terminal, and therefore, verify whether the test pattern to be used for a test for confirmation of the reliability of the gate of each transistor is favorable or not.

In the semiconductor integrated circuit inspection method according to the present invention, the time during which the voltage applied upon each of the transistors remains equal to or higher than the predetermined voltage is measured using the circuit simulator for the semiconductor integrated circuit.

According to the present invention, the time during which the voltage applied upon each transistor remains equal to or higher than the predetermined voltage is measured using the circuit simulator for the semiconductor integrated circuit. Hence, it is possible to grasp the state of the voltage applied upon each transistor which forms the semiconductor integrated circuit, utilizing a simulation result obtained with the circuit simulator.

The semiconductor integrated circuit inspection method according to the present invention is characterized in that the circuit simulator is a SPICE simulator and a connecting relation of the transistors is described in a SPICE net list.

According to the present invention, through execution of simulation using the SPICE simulator, the voltage applied upon each transistor is measured in response to inputting of the test pattern to the semiconductor integrated circuit comprising the plural transistors. Hence, it is possible to grasp the state of the voltage applied upon each transistor during inspection of the semiconductor integrated circuit using this test pattern based on the simulation result.

The semiconductor integrated circuit inspection method according to the present invention is characterized in counting the number of transistors as for which the calculated ratio to the inspection time is greater than a predetermined ratio and calculating the ratio of the count of the transistors to the total number of transistors which the semiconductor integrated circuit comprises.

The present invention requires counting the number of those transistors as for which the ratio of the application time of the voltage which is equal to or higher than the predetermined voltage to the total inspection time is greater than the predetermined ratio and calculating the ratio of thus identified transistor count to the total number of transistors which the semiconductor integrated circuit comprises. Hence, it is possible to grasp the ratio of those transistors upon which the voltage which is equal to or higher than the predetermined voltage is applied for a longer time than the predetermined ratio to the total inspection time to the total number of the transistors which form the semiconductor integrated circuit, in response to inputting of the test pattern generated for inspection of the semiconductor integrated circuit to the input terminal, and therefore, it is possible to verify whether the generated test pattern is favorable or not.

The semiconductor integrated circuit inspection method according to the present invention is characterized in acquiring layout information regarding the location of each of the transistors and generating display data in which the locations according to the layout information regarding the location of each transistor are denoted at marks in plural colors depending upon the calculated ratio to the inspection time.

According to the present invention, the display data are generated in which the locations according to the layout information regarding the location of each transistor are denoted at marks in plural colors depending upon the ratio of the time during which the voltage applied upon each transistor remains equal to or higher than the predetermined voltage to the total inspection time. Hence, it is possible to grasp variations among the voltages applied upon the respective transistors based on thus generated display data, in response to inputting of the test pattern generated for inspection of the semiconductor integrated circuit to the input terminal.

The semiconductor integrated circuit inspection apparatus according to the present invention is an inspection apparatus for inspecting a semiconductor integrated circuit comprising plural transistors, in which a test pattern generated for the semiconductor integrated circuit is input to the semiconductor integrated circuit comprising: a measuring part which measures a time during which a voltage applied upon each of the transistors remains equal to or higher than a predetermined voltage, in response to inputting of the test pattern; and a calculating part which calculates the ratio of the measured time to a inspection time for the semiconductor integrated circuit.

According to the present invention, in response to inputting of the test pattern generated for the semiconductor integrated circuit comprising the plural transistors to the semiconductor integrated circuit, the time during which the voltage applied upon each one of the transistors remains equal to or higher than the predetermined voltage is measured, and the ratio of thus measured time to the inspection time for the semiconductor integrated circuit is calculated. Hence, it is possible to grasp, as for each transistor, the ratio of the application time of the voltage which is equal to or higher than the predetermined voltage to the inspection time, in response to inputting of the test pattern generated for inspection of the semiconductor integrated circuit.

The semiconductor integrated circuit inspection apparatus according to the present invention is characterized in the time during which the voltage applied upon each of the transistors remains equal to or higher than the predetermined voltage is measured using a circuit simulator for the semiconductor integrated circuit.

According to the present invention, the time during which the voltage applied upon each one of the transistors remains equal to or higher than the predetermined voltage is measured using the circuit simulator for the semiconductor integrated circuit. Hence, it is possible to grasp the state of the voltage applied upon each transistor which forms the semiconductor integrated circuit, utilizing a simulation result obtained with the circuit simulator.

The semiconductor integrated circuit inspection apparatus according to the present invention is characterized in the circuit simulator is a SPICE simulator and a connecting relation of the transistors is described in a SPICE net list.

According to the present invention, through execution of simulation using the SPICE simulator, the voltage applied upon each transistor is measured in response to inputting of the test pattern to the semiconductor integrated circuit comprising the plural transistors. Hence, it is possible to grasp the state of the voltage applied upon each transistor during inspection of the semiconductor integrated circuit using this test pattern based on the simulation result.

According to the present invention, in response to inputting of the test pattern generated for inspection of the semiconductor integrated circuit comprising the plural transistors to the input terminal of the semiconductor integrated circuit, the time during which the voltage applied upon each transistor remains equal to or higher than the predetermined voltage is measured. Further, the ratio of thus measured time to the inspection time for the semiconductor integrated circuit is calculated. Due to this, during a reliability test on the semiconductor integrated circuit, it is possible to grasp, as for each transistor, the ratio of the application time of the voltage which is equal to or higher than the predetermined voltage to the inspection time, and therefore, verify whether the test pattern to be used for the reliability test is favorable or not. Since it is possible to easily grasp the state of the voltage applied upon each transistor during the reliability test even when the circuit size of the semiconductor integrated circuit has increased, it is possible to maintain the accuracy of the reliability test on the semiconductor integrated circuit.

According to the present invention, in response to inputting of the test pattern to the input terminal of the semiconductor integrated circuit comprising the plural transistors, the time during which the voltage applied upon the gate of each transistor remains equal to or higher than the predetermined voltage is measured. Thus, it is possible to grasp the state of the voltage applied upon the gate of each transistor in response to inputting of the test pattern to the input terminal and verify whether the test pattern to be used for a test for confirmation of the reliability of the gate of each transistor is favorable or not.

According to the present invention, using the circuit simulator for the semiconductor integrated circuit to be inspected, the time during which the voltage applied upon each transistor which forms the semiconductor integrated circuit remains equal to or higher than the predetermined voltage is measured. Thus, it is possible to grasp the state of the voltage applied upon each transistor during inspection of the semiconductor integrated circuit utilizing a simulation result obtained with the circuit simulator, and therefore, verify whether the test pattern is favorable or not.

According to the present invention, through execution of the SPICE simulation run with the SPICE simulator using the SPICE net list which describes the semiconductor integrated circuit comprising the plural transistors, the voltage applied upon each transistor is measured during a reliability test. Thus, it is possible to grasp the state of the voltage applied upon each transistor during inspection of the semiconductor integrated circuit utilizing the result of the SPICE simulation, and therefore, verify whether the test pattern is favorable or not.

The present invention requires counting the number of transistors as for which the ratio of the application time of the voltage which is equal to or higher than the predetermined voltage to the total inspection time is greater than the predetermined ratio and calculating the ratio of thus identified transistor count to the total number of transistors which the semiconductor integrated circuit comprises. Thus, it is possible to grasp the ratio of those transistors upon which the voltage which is equal to or higher than the predetermined voltage is applied for a longer time than the predetermined ratio to the total inspection time, that is, those transistors upon which a proper voltage is applied for a proper amount of time to the total number of the transistors which form the semiconductor integrated circuit, and therefore, verify whether the test pattern to be used for the reliability test is favorable or not based on this ratio.

The present invention requires generating the display data in which the locations according to the layout information regarding the location of each transistor are denoted at marks in plural colors depending upon the ratio of the time during which the voltage applied upon each transistor remains equal to or higher than the predetermined voltage to the total inspection time. Hence, it is possible to graphically display, using the marks in the corresponding colors, the application time of the voltage which is equal to or higher than the predetermined voltage during the reliability test for the semiconductor integrated circuit, and therefore, grasp variations among the voltages applied upon the respective transistors at a glance with reference to the location of each transistor. This reduces a burden of test pattern correction.

The above and further objects and features of the invention will more fully be apparent from the following detailed description with accompanying drawings.

BRIEF DESCRIPTION OF THE SEVERAL VIEWS OF THE DRAWINGS

FIG. 4 is a schematic diagram showing an example of the structure of a net list;

FIG. 7 is a flowchart which shows the sequence of processing for inspecting a semiconductor integrated circuit using the EWS according to a second embodiment.

DETAILED DESCRIPTION OF THE INVENTION

A detailed description will now be given on processing according to the semiconductor integrated circuit inspection method of the present invention and the semiconductor integrated circuit inspection apparatus of the present invention, with reference to the associated drawings which illustrate embodiments of the invention. With the semiconductor integrated circuit inspection method of the present invention, it is possible to verify whether an inspection test pattern for verification of the durability of a gate oxide film of each transistor which forms a semiconductor integrated circuit, i.e., a part of a durability test conducted prior to shipment of the semiconductor integrated circuit, is such a test pattern which realizes application of an appropriate voltage upon the gate oxide film of each transistor for an appropriate amount of time.

First Embodiment

Figure 1:
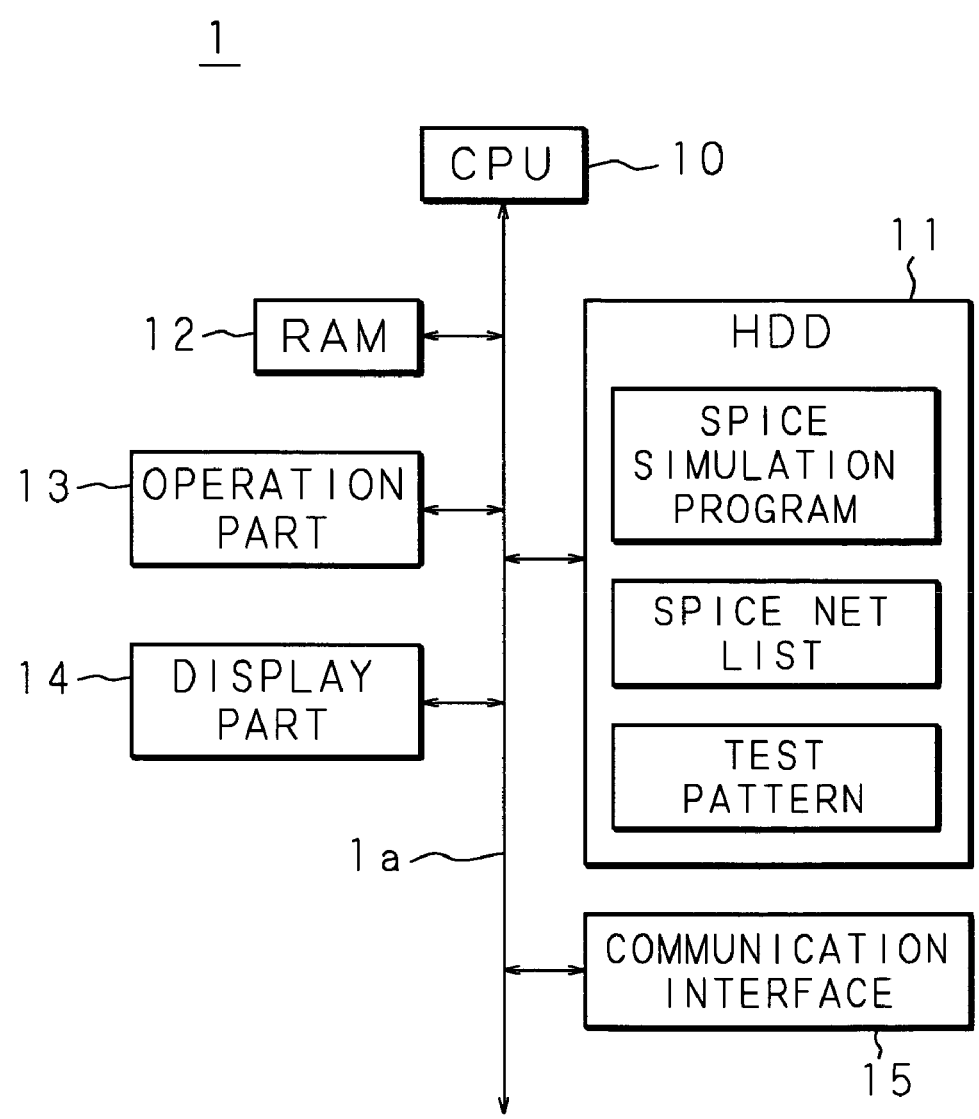
FIG. 1 is a block diagram showing an example of the structure of essential portions of an EWS which is a semiconductor integrated circuit inspection apparatus according to the present invention.

FIG. 1 is a block diagram showing an example of the structure of essential portions of an EWS (Engineering Work Station) which is a semiconductor integrated circuit inspection apparatus according to the present invention. The semiconductor integrated circuit inspection apparatus is not limited to an EWS but may instead be a personal computer or the like. The EWS 1 comprises a CPU 10, an HDD (Hard Disk Drive) 11, a RAM 12, an operation part 13 comprising a key board, a mouse, etc., a display part 14 formed by a liquid crystal display, a CRT display or the like, a communication interface 15 which is for data transmission with other EWS on a communication network such as LAN (Local Area Network), etc., and these are connected with each other by a bus 1a.

The CPU 10 comprises a timer (not shown), controls the respective hardware parts above connected via the bus 1a, reads a control program pre-stored in the HDD 11 to the RAM 12 when needed and executes the control program. Stored in advance within the HDD 11 includes various types of control programs which are necessary for the EWS 1 to operate as the semiconductor integrated circuit inspection apparatus of the present invention, a SPICE (Simulation Program with Integrated Circuit Emphasis) simulation program, etc. The RAM 12 is formed by an SRAM, a flash memory or the like, and temporarily stores data which are created when the CPU 10 executes a control program.

The EWS 1 having the structure above is capable of making, when needed, the CPU 10 execute a control program stored in the HDD 11 in response to an operation which a user provide on the operation part 13, and as the CPU 10 executes the SPICE simulation program stored in the HDD 11, the EWS 1 according to the first embodiment operates as a SPICE simulator. When wishing to execute SPICE simulation with the EWS 1 operating as a SPICE simulator, a user operates the operation part 13 and generates and edits in advance a SPICE net list which will be simulated and a test pattern which will be used for a durability test of gate oxide films.

The SPICE net list and the test pattern thus prepared are stored in the HDD 11, and read when needed and treated when the CPU 10 executes the SPICE simulation program. A file resulting from execution of the SPICE simulation by the CPU 10 is also accumulated in the HDD 11. The SPICE net list may be generated by a user from the SPICE format, or generated through conversion from an RTL (Resister Transfer Level) or gate-level net list using a conversion program.

From the result of the SPICE simulation, the CPU 10 of the EWS 1 having the structure above measures the time during which a voltage applied upon the gate oxide film of each transistor stays equal to or higher than a predetermined voltage during a durability test of the gate oxide films using the pre-generated test pattern. The CPU 10 then calculates the ratio of thus measured time to the total inspection time of the SPICE simulation (hereinafter referred to as "the stress application time ratio"), and counts the number of transistors as for which thus calculated stress application time ratios exceed a predetermined ratio. Further, the CPU 10 calculates the ratio of thus identified transistor count to the total number of the transistors which form the semiconductor integrated circuit (hereinafter referred to as "the stress-activation rate").

The stress-activation rate calculated in this manner is indicative of the ratio of those transistors upon which a voltage higher than the predetermined voltage is applied for a longer time than the predetermined ratio to the total inspection time, namely, those transistors upon which a proper voltage is applied for a proper amount of time to the total number of the transistors during the durability test of the gate oxide films using the pre-generated test pattern, and it is possible to verify whether the test pattern used for the SPICE simulation is preferable or not based on the stress-activation rate. To be more specific, when the calculated stress-activation rate is low, it is concluded that the durability test of the gate oxide films using this test pattern is not a proper test.

Figures 2A, 2B:
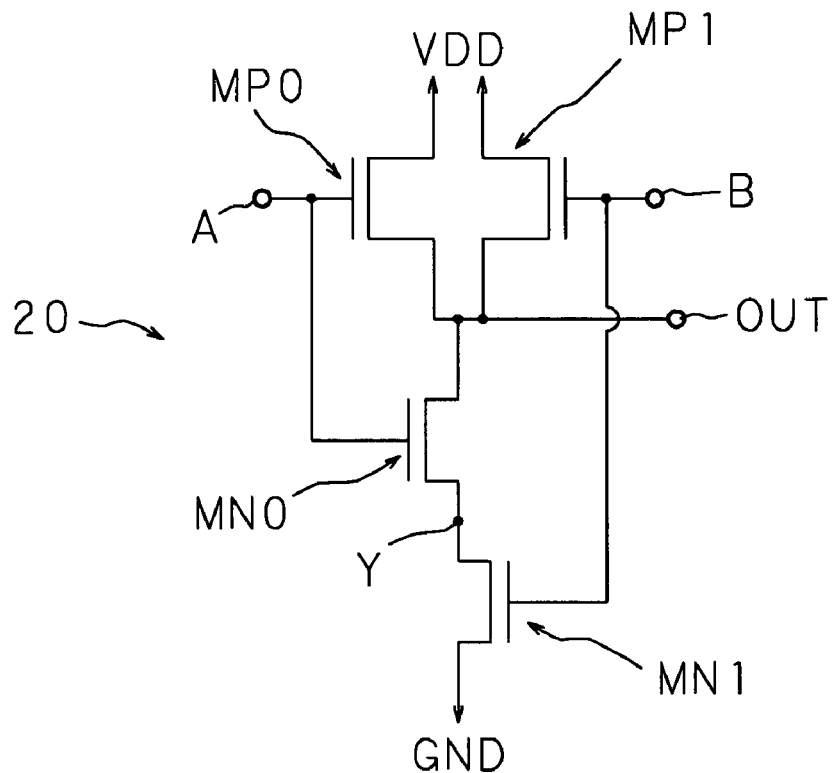
FIG. 2A is a schematic circuit diagram of an NAND circuit.
FIG. 2B is a conceptual view of a SPICE net list which represents the NAND circuit.

Processing for inspecting a semiconductor integrated circuit using the EWS 1 above will now be described. For simplicity of description, SPICE simulation on a 2-input NAND circuit 20 will now be described on the assumption that the 2-input NAND circuit 20 is a semiconductor integrated circuit to be inspected according to the first embodiment. FIG. 2A is a schematic circuit diagram of the NAND circuit 20, while FIG. 2B is a conceptual view of a SPICE net list which represents the NAND circuit 20.

In the first embodiment, the NAND circuit 20 comprises two input terminals A and B, one output terminal OUT, two P-type transistors MP0 and MP1 and two N-type transistors MN0 and MN1. The input terminal A is connected with the gates of the transistors MP0 and MN0, the input terminal B is connected with the gates of the transistors MP1 and MN1, the drains of the transistors MP0, MP1 and MN0 are connected with the output terminal OUT, and the source of the transistor MN0 is connected with the drain of the transistor MN1. Further, the sources of the transistors MP0 and MP1 are each connected with a power source VDD not shown and the source of the transistor MN1 is connected with the ground GND, so that the NAND circuit 20 operates at an applied voltage of 3.0±0.3 V supplied from the power source VDD.

The net list in FIG. 2B is a description of the NAND circuit 20 shown in FIG. 2A in the SPICE format. This SPICE net list expresses how the respective transistors are connected, and describes as for each transistor the transistor name, the drain node, the gate node, the source node, the bulk node and the transistor type in this order. In FIG. 2A, the source of the transistor MN0 and the drain of the transistor MN1 are the node Y.

Further, as the applied voltage of 3.3 V is a stress condition for the SPICE simulation on the NAND circuit 20 described above in the first embodiment, this condition is also described in the SPICE net list. Noting that the NAND circuit 20 is a circuit which operates at a voltage of 3.0±0.3 V, the stress condition is 3.3 V. In other words, the power source VDD in the SPICE net list shown in FIG. 2B means 3.3 V and the ground GND in the list means 0.0 V.

Figure 3A:
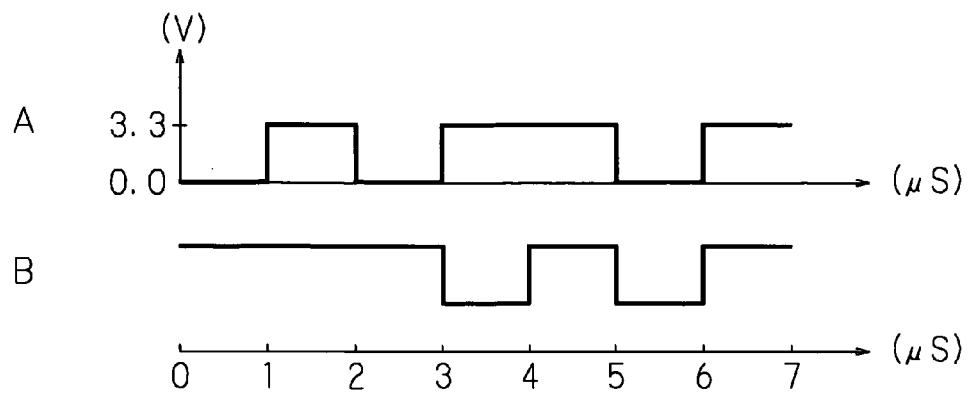
FIG. 3A is an explanatory diagram for describing input signals representing a test pattern.

FIG. 3A shows an example of input signals representing a test pattern for the SPICE simulation on the SPICE net list which is shown in FIG. 2B. FIG. 3A illustrates the test pattern based on the time measured along the horizontal axis in the units of μS and the voltage measured along the vertical axis: Input signals whose waveforms change between the low level of 0.0 V and the high level of 3.3 V are input respectively to the input terminals A and B.

In the EWS 1, the HDD 11 stores the SPICE net list and the test pattern described above, and when executing the SPICE simulation program, the CPU 10 accumulates, in a file, changes of voltages at the output terminal OUT and the nodes of the respective transistors of the NAND circuit 20.

For clarification of the transistor name, the drain node, the gate node, the source node and the bulk node of each transistor which forms the NAND circuit 20, the CPU 10 first extracts the transistor name and the respective nodes of each transistor from the SPICE net list and generates a list as that shown in FIG. 4 during execution of the SPICE simulation program. The CPU 10 then executes the SPICE simulation using the SPICE net list and the test pattern, and accordingly acquires voltage changes at the output terminal OUT and the nodes of the respective transistors as those shown in FIG. 3B.

Figure 3B:
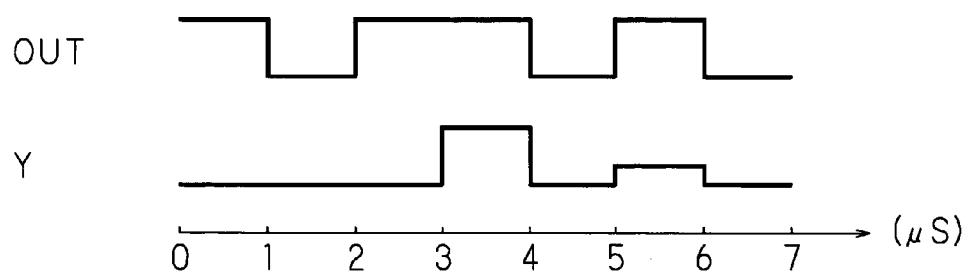
FIG. 3B is an explanatory diagram for describing waveforms which are indicative of changes of voltages at an output terminal and an internal node.

FIG. 3B shows changes of the voltages at the output terminal OUT and the internal node Y in response to input of the test pattern described above, in which the horizontal axis denotes time and the vertical axis denotes the voltages as in FIG. 3A. Acquiring the voltage changes at the output terminal OUT and the respective nodes, the EWS 1 can extract, based on these voltage changes, voltage changes applied upon the gate oxide films of the respective transistors during execution of the SPICE simulation program.

Figure 3C:
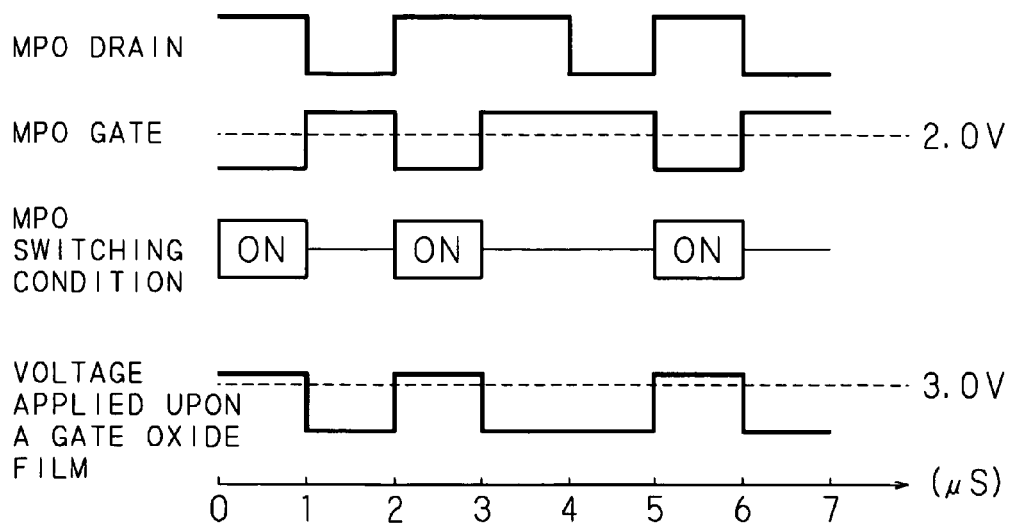
FIG. 3C is an explanatory diagram for describing a method of extracting the changes of a voltage which is applied upon a gate oxide film of a transistor.

FIG. 3C is a drawing for describing a method of extracting the changes of the voltage applied upon the gate oxide film of the transistor MP0, in which the top two waveforms represent voltage changes at the drain and the gate respectively of the transistor MP0 which are found through the SPICE simulation. In FIG. 3C as well, the horizontal axis denotes time and the vertical axis denotes the voltages as in FIG. 3A. Assuming that the time at which the voltage is applied upon the gate oxide film of the transistor MP0 is the time at which the transistor MP0 is ON, it is necessary to grasp the ON-state of the transistor MP0 for extraction of the changes of the voltage applied upon the gate oxide film of the transistor MP0.

The first embodiment assumes that a predetermined threshold value is 1.3 V and determines from the bulk voltage value (3.3 V)—the threshold value (1.3 V) that the transistor MP0 is ON when the gate voltage becomes lower than 2.0 V. Due to this, the CPU 10 of the EWS 1 can detect that the transistor MP0 switches to the ON-state from the beginning of the SPICE simulation to 1 μS, from 2 μS to 3 μS and from 5 μS to 6 μS as shown in FIG. 3C. The threshold value may be set appropriately depending upon the characteristics and the bulk voltage values of the respective transistors.

The first embodiment further assumes that when the transistor MP0 is ON, the value of the gate oxide film voltage applied upon the gate oxide film of the transistor MP0 is a value calculated by subtracting the value of the gate voltage applied upon the gate of the transistor MP0 from the value of the drain voltage applied upon the drain of the transistor MP0, which permits the CPU 10 of the EWS 1 to calculate voltage changes in the gate oxide film as those shown in FIG. 3C. While the foregoing has just described that the value of the gate oxide film voltage is calculated by subtracting the value of the gate voltage from the value of the drain voltage, the value of the drain voltage may be replaced with a value which is calculated by (the value of the source voltage+the value of the drain voltage)/2.

Based on the voltage changes in the gate oxide film calculated in this fashion, the CPU 10 of the EWS 1 measures the time during which the voltage applied upon the gate oxide film of the transistor MP0 remains equal to or higher than the predetermined voltage. Where the predetermined voltage is 3.0 V, the CPU 10 of the EWS 1 can measure 3 μS which are from the beginning of the SPICE simulation to 1 μS, from 2 μS to 3 μS and from 5 μS to 6 μS.

Further, the CPU 10 of the EWS 1 calculates the stress application time ratio of thus measured time (3 μS) to the total inspection time of the SPICE simulation. Since the total inspection time of the SPICE simulation is 7 μS, the CPU 10 calculates by (the measured time: 3 μS)/(the total inspection time of the SPICE simulation: 7 μS)×100 and yields the stress application time ratio of 43%.

The CPU 10 of the EWS 1 calculates the stress application time ratio above as for each transistor, and although the details of the calculation will not be described here, identifies by calculation that the stress application time ratio is 28% for the transistor MP1, the stress application time ratio is 43% for the transistor MN0 and the stress application time ratio is 71% for the transistor MN1 in this embodiment.

The CPU 10 also determines whether the stress application time ratio calculated as for each transistor is larger than the predetermined ratio, counts the number of transistors as for which thus calculated stress application time ratios exceed the predetermined ratio, and calculates the stress-activation rate to the total number of the transistors which form the NAND circuit 20. Assuming that the predetermined ratio is 50%, since the transistor MN1 alone is a transistor as for which the stress application time ratio is greater than the predetermined ratio and since the total number of the transistors is 4, the CPU 10 calculates that the stress-activation rate is 25% from (the number of transistors as for which the stress application time ratios exceed the predetermined ratio: 1)/ (the total number of the transistors: 4)×100.

It is thus possible to calculate the ratio (the stress-activation rate) of the transistors whose gate oxide films are applied with the proper voltage for the proper amount of time during the durability test of the gate oxide films using the pre-generated test pattern based on the result of the SPICE simulation using the SPICE net list and the test pattern, which in turns permits a user to verify whether the test pattern used for the SPICE simulation is preferable or not based on the calculated stress-activation rate.

Figure 5:
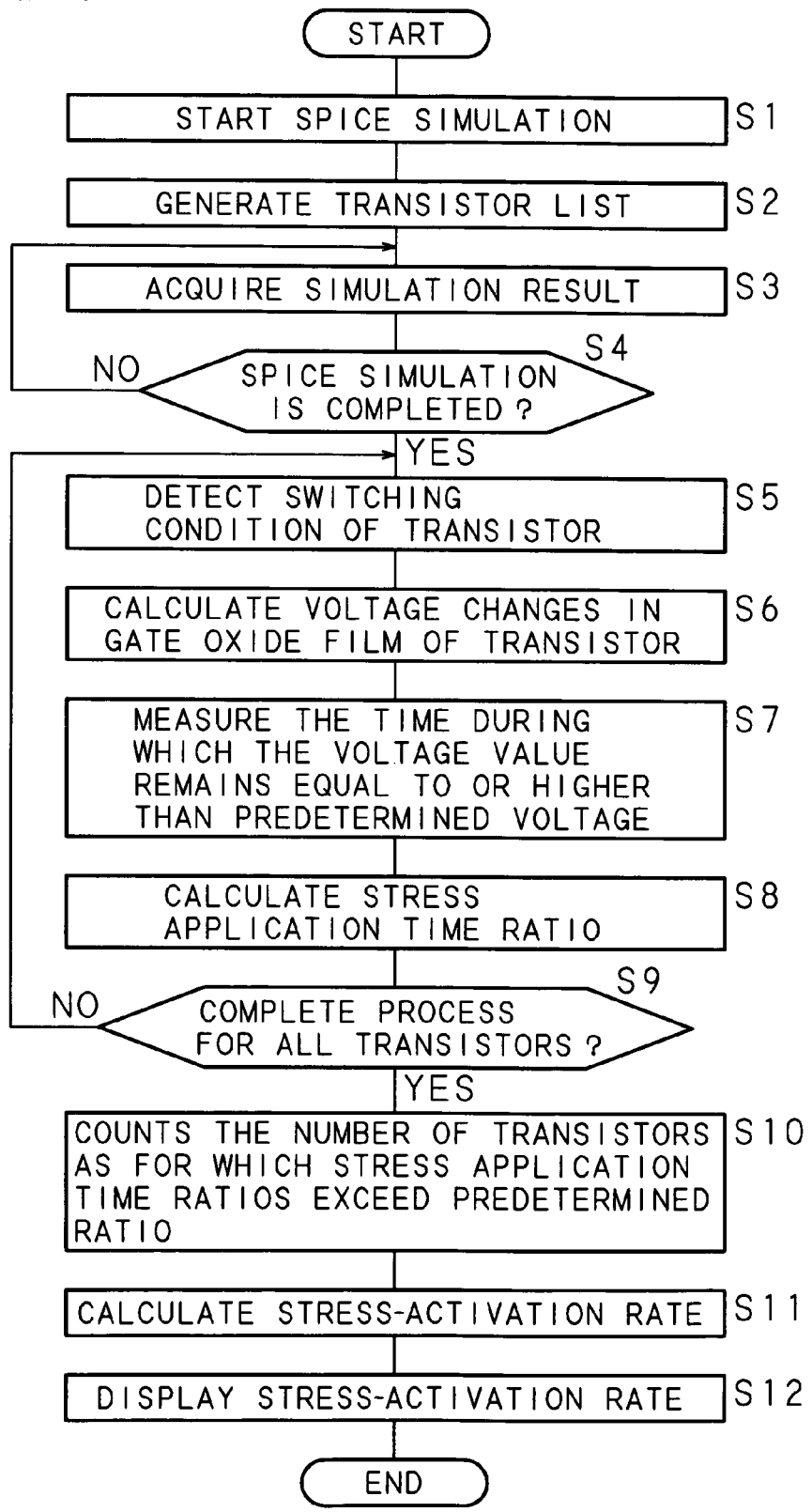
FIG. 5 is a flowchart which shows the sequence of processing for inspecting a semiconductor integrated circuit using the EWS according to a first embodiment.

The processing for inspecting a semiconductor integrated circuit above will now be described with reference to the associated flowchart. FIG. 5 is a flowchart which shows the sequence of processing for inspecting a semiconductor integrated circuit using the EWS 1 according to the first embodiment. It is the CPU 10 that executes the processing below in accordance with a control program stored in the HDD 11 of the EWS 1.

When wishing to verify a test pattern he plans to use for a durability test of gate oxide films of a semiconductor integrated circuit is favorable or not based on the result of the SPICE simulation, a user prepares a SPICE net list and the test pattern for the semiconductor integrated circuit he wishes to simulate, stores the SPICE net list and the test pattern in the HDD 11 of the EWS 1, appropriately operates the operation part 13 and accordingly makes the CPU 10 run the SPICE simulation program.

The CPU 10 reads the SPICE simulation program stored in the HDD 11 to the RAM 12 and executes the SPICE simulation program sequentially, thus realizing operations as a SPICE simulator and starting the SPICE simulation (S1). First, the CPU 10 extracts the transistor name and the respective nodes of each transistor from the SPICE net list and generates a transistor list (S2), and then acquires, as the simulation result, voltage changes at the output terminal OUT of the semiconductor integrated circuit and the respective nodes of each transistor (S3).

The CPU 10 determines whether the SPICE simulation has ended based on whether all test patterns have been input to the SPICE net list (S4), and when determining that the SPICE simulation has not ended (S4: NO), continues acquiring the simulation result until the SPICE simulation comes to the end (S3).

When determining that the SPICE simulation has ended (S4: YES), the CPU 10 detects switching of each transistor during execution of the SPICE simulation based on the simulation result thus acquired (S5). To be more specific, from the predetermined threshold value, the CPU 10 determines that the transistor is ON when the gate voltage at this transistor becomes lower than 2.0 V, calculates the value of the voltage applied upon the gate oxide film by subtracting the gate voltage value from the drain voltage value of the transistor when determining that the transistor is ON, and calculates voltage changes in the gate oxide film of the transistor (S6).

Further, as for the calculated voltage changes in the gate oxide film, the CPU 10 measures the time during which the voltage value remains equal to or higher than the predetermined voltage (which may be 3.0 V for instance) (S7), and calculates the stress application time ratio of the measured time to the total inspection time of the SPICE simulation (S8). As for all transistors appearing in the transistor list generated at Step S2, the CPU 10 determines whether the processing of calculating the stress application time ratio has finished as described above (S9), and when determining that the processing has not finished (S9: NO), shifts the processing to Step S5 and repeats the processing from S5 to S8.

When determining that the processing has finished for all transistors (S9: YES), the CPU 10 determines as for each transistor whether the calculated stress application time ratio is equal to or higher than the predetermined ratio and counts the number of transistors as for which the stress application time ratios exceed the predetermined ratio (S10). The CPU 10 further calculates the stress-activation rate of thus identified transistor count to the total number of the transistors which form the semiconductor integrated circuit (S11), makes the display part 14 show the calculated stress-activation rate (S12), and ends the processing for inspecting the semiconductor integrated circuit above.

In this manner, during a durability test of gate oxide films, it is possible to grasp the ratio of transistors whose gate oxide films are applied with a proper voltage for a proper amount of time, based on the result of SPICE simulation using a test pattern, which is for the durability test of the gate oxide films of transistors which form a semiconductor integrated circuit, and a SPICE net list which expresses the semiconductor integrated circuit. Hence, when the ratio of transistors applied with the proper voltage for the proper amount of time is low, it is determined that the test pattern used for inspection is not favorable, based on which the test pattern may be corrected and a durability test using a more suitable test pattern may be performed.

Second Embodiment

The foregoing has described the first embodiment in relation to a structure which verifies, based on a stress application time ratio, whether a test pattern used for a durability test of gate oxide films of transistors, i.e., a part of a reliability test on a semiconductor integrated circuit, is such a test pattern which realizes application of an appropriate voltage upon the gate oxide film of each transistor for an appropriate amount of time.

As the second embodiment, a description will now be given on a structure with which it is possible to grasp, while referring to the location of each transistor, those transistors upon which a proper voltage is applied for a proper amount of time and those transistors upon which the proper voltage is not applied in response to inputting of a pre-generated test pattern at an input terminal of a semiconductor integrated circuit. Since a similar structure to that of the EWS 1 according to the first embodiment described above realizes the semiconductor integrated circuit inspection apparatus according to the second embodiment, the structure of the EWS which is the semiconductor integrated circuit inspection apparatus will not be described.

In the second embodiment, when wishing to verify a test pattern he plans to use for a durability test of gate oxide films of a semiconductor integrated circuit is favorable or not based on the result of SPICE simulation, in addition to a SPICE net list he wishes to simulate and the test pattern to be used for the durability test of the gate oxide films, a user prepares coordinates data expressing the respective coordinates in an actual layout of the transistors described in the SPICE net list. The coordinates of each transistor are the x-coordinate and the y-coordinate relative to a reference point which serves as the reference.

A method of obtaining the coordinates data expressing the coordinates of each transistor includes, but not limited to, a method according to which predetermined checking is conducted on the SPICE net list and layout data for instance, which express a layout result based on the SPICE net list, using a known layout tool, whether the SPICE net list matches with the layout data is then confirmed, predetermined RC extraction of intermediate data created when the two match thereafter follows, and coordinates data which coincide with the layout of the transistors are obtained.

In the EWS 1 according to the second embodiment as well, the CPU 10 runs SPICE simulation as that described earlier in relation to the first embodiment and calculates the stress application time ratio as for each transistor. The CPU 10 of the EWS 1 according to the second embodiment generates a stress application status map (display data) in which the locations corresponding to the coordinates of the respective transistors appear as marks in different colors in accordance with whether the stress application time ratios calculated as for the respective transistors are greater than the predetermined ratio.

To be more specific, as described earlier in relation to the first embodiment, in the NAND circuit 20 shown in FIG. 2A, the CPU 10 of the EWS 1 assigns different colors to the respective transistors between when the calculated stress application time ratio exceeds the predetermined ratio (which may be 50% for example) and when the calculated stress application time ratio is below the predetermined ratio after calculating the stress application time ratios as for the transistors MP0 and MN0 to be 43%, that for the transistor MN1 to be 71% and that for the transistor MP1 to be 28%. The CPU 10 then reads the coordinates of the respective transistors from the coordinates data stored in the HDD 11, correlates marks in the assigned colors to the locations corresponding to thus read coordinates, and accordingly generates a stress application status map as that shown in FIG. 6.

Figure 6:
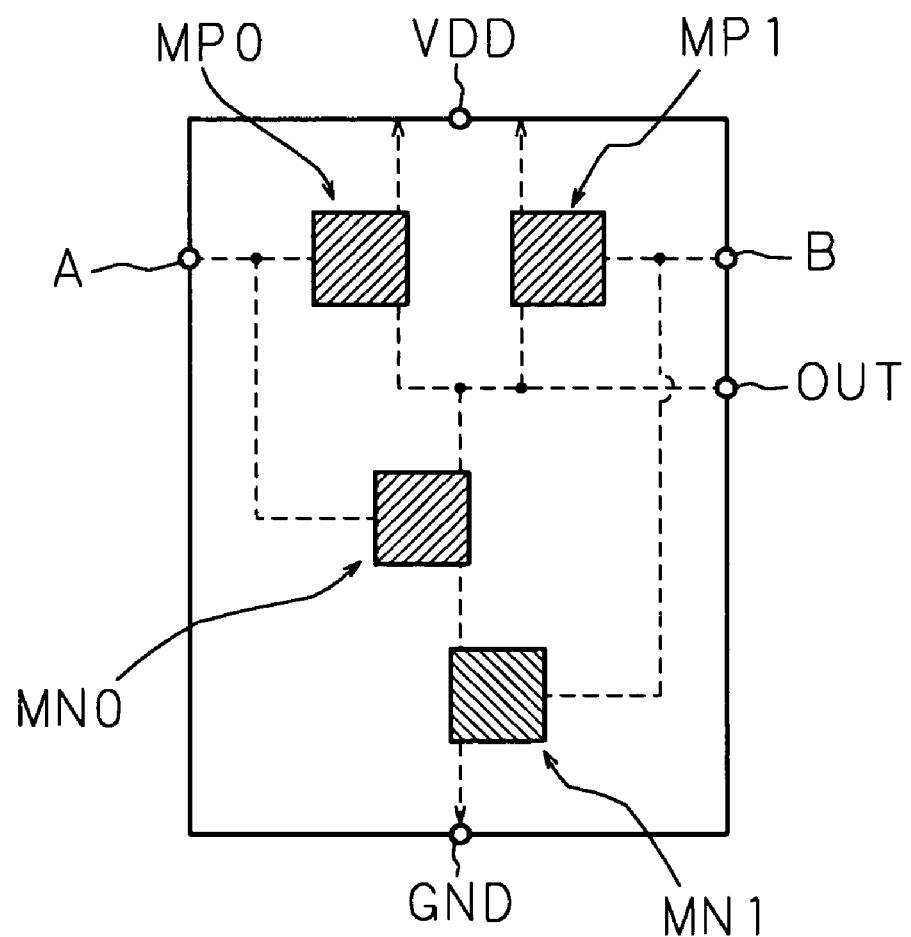
FIG. 6 is a schematic diagram which shows an example of the structure of a stress application status map.

The display part 14 of the EWS 1 for instance displays the stress application status map. In FIG. 6, the shaded sections representing the transistors MP0, MP1 and MN0 and the shaded sections representing the transistor MN1 are in different colors. In the stress application status map, the stress application time ratios as for the respective transistors may be painted in three or more colors instead of two colors: For instance, the stress application time ratios as for the respective transistors may show darker every 10% and in different colors.

It is thus possible to grasp, at a glance with reference to the location of each transistor, those transistors whose gate oxide films are applied with a proper voltage for a proper amount of time and those transistors upon which the proper voltage is not applied during a durability test of the gate oxide films of the transistors which is carried out using a pre-generated test pattern based on the result of SPICE simulation. Further, it is possible to correct the test pattern depending upon variations among the stress application time ratios as for the respective transistors which are depicted in the stress application status map, and hence, reduce a burden of test pattern correction.

Processing for inspecting a semiconductor integrated circuit in the second embodiment above will now be described with reference to the associated flowchart. FIG. 7 is a flowchart which shows the sequence of processing for inspecting a semiconductor integrated circuit using the EWS 1 according to the second embodiment. It is the CPU 10 that executes the processing below in accordance with a control program stored in the HDD 11 of the EWS 1.

When wishing to verify a test pattern he plans to use for a durability test of gate oxide films of a semiconductor integrated circuit is favorable or not based on the result of the SPICE simulation, a user prepares a SPICE net list and the test pattern for the semiconductor integrated circuit he wishes to simulate and coordinates data expressing the coordinates of the respective transistors of the semiconductor integrated circuit, stores these in the HDD 11 of the EWS 1, appropriately operates the operation part 13 and accordingly makes the CPU 10 run the SPICE simulation program. As described earlier as Step S1 to Step S9 in FIG. 5 in relation to the first embodiment, the CPU 10 executes the SPICE simulation and based on the result of the SPICE simulation, calculates the stress application time ratio as for each transistor.

After finishing calculating the stress application time ratios as for all transistors, the CPU 10 assigns different colors depending upon whether the stress application time ratios thus calculated as for the transistors are equal to or greater than the predetermined ratio (S21). Further, the CPU 10 reads the coordinates of the respective transistors from the coordinates data stored in the HDD 11 (S22), and correlates marks in the colors assigned at Step S21 to the locations which are denoted by thus read coordinates relative to the reference point and generates a stress application status map (S23).

As described earlier, the CPU 10 determines whether the processing of arranging the associated color marks to all transistors which form the semiconductor integrated circuit has ended (S24), and when determining that the processing has not finished (S24: NO), shifts the processing to Step S21 and repeats the processing from S21 to S23. On the contrary, when determining that the processing has finished (S24: YES), the CPU 10 makes the display part 14 display the stress application status map of FIG. 6 (S25), and terminates the processing for inspecting the semiconductor integrated circuit described above.

In this fashion, it is possible to display, in accordance with their locations, those transistors whose gate oxide films are applied with a proper voltage for a proper amount of time and those transistors upon which the proper voltage is not applied during a durability test of the gate oxide films of the transistors which is carried out using the pre-generated test pattern based on the result of the SPICE simulation, so that a user can instantly grasp lopsided application of the voltages upon the transistors while looking at the displayed stress application status map. Further, it is possible to correct the test pattern in light of the lopsided application of the voltages upon the transistors, reduce a burden of test pattern correction and perform a durability test using a more suitable test pattern.

Although the foregoing has described inspection of a semiconductor integrated circuit according to the embodiments on the assumption that the semiconductor integrated circuit is the NAND circuit 20, use of the method described above makes it easy to grasp the level of completion of a test pattern to be used for a durability test of gate oxide films of a liquid crystal display driver as well which has become increasingly high-performance over the recent years, and hence, reduce a burden of test pattern generation and perform an even more accurate reliability test on a semiconductor integrated circuit.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A semiconductor integrated circuit inspection method comprising the steps of:
    inputting a test pattern, which is generated for a semiconductor integrated circuit comprising plural transistors, to said semiconductor integrated circuit;
    measuring a time during which a voltage applied upon each of said transistors remains equal to or higher than a predetermined voltage, in response to inputting of said test pattern; and
    calculating a ratio of the measured time to an inspection time for said semiconductor integrated circuit.

2. The semiconductor integrated circuit inspection method according to claim 1, wherein the time during which the voltage applied upon a gate of each of said transistors remains equal to or higher than the predetermined voltage is measured.

3. The semiconductor integrated circuit inspection method according to claim 1, wherein the time during which the voltage applied upon each of said transistors remains equal to or higher than the predetermined voltage is measured using a circuit simulator for said semiconductor integrated circuit.

4. The semiconductor integrated circuit inspection method according to claim 3, wherein said circuit simulator is a SPICE simulator and a connecting relation of said transistors is described in a SPICE net list.

5. The semiconductor integrated circuit inspection method according to claim 1, further comprising the steps of:
    counting the number of transistors as for which calculated stress application time ratio to said inspection time is greater than a predetermined ratio; and
    calculating the ratio of the count of the transistors to the total number of transistors which said semiconductor integrated circuit comprises.

6. The semiconductor integrated circuit inspection method according to claim 1, further comprising the steps of:
    acquiring layout information regarding a location of each of said transistors; and
    generating display data in which the locations according to said layout information regarding the location of each of said transistors are denoted at marks in plural colors depending upon the calculated ratio to said inspection time.

7. A semiconductor integrated circuit inspection apparatus for inspecting a semiconductor integrated circuit comprising plural transistors, in which a test pattern generated for said semiconductor integrated circuit is input to said semiconductor integrated circuit comprising:
    a measuring part which measures a time during which a voltage applied upon each of said transistors remains equal to or higher than a predetermined voltage, in response to inputting of said test pattern; and
    a calculating part which calculates a stress application time ratio of the measured time to an inspection time for said transistors of the measured time to an inspection time for said semiconductor integrated circuit.

8. The semiconductor integrated circuit inspection apparatus according to claim 7, wherein the time during which the voltage applied upon each of said transistors remains equal to or higher than the predetermined voltage is measured using a circuit simulator for said semiconductor integrated circuit.

9. The semiconductor integrated circuit inspection apparatus according to claim 8, wherein said circuit simulator is a SPICE simulator and a connecting relation of said transistors is described in a SPICE net list.

* * * * *